(12) United States Patent
Werner et al.

(10) Patent No.: US 12,439,507 B2
(45) Date of Patent: Oct. 7, 2025

(54) SAFETY AND EMC COMPLIANT INTERNAL POWER PLANE HEAT SINK CAPACITOR

(71) Applicant: International Business Machines Corporation, Armonk, NY (US)

(72) Inventors: John S. Werner, Fishkill, NY (US); Piyush Kashyap, Highland, NY (US); Samuel R. Connor, Apex, NC (US); Yuanchen Hu, Wappingers Falls, NY (US); Kevin O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 18/148,465

(22) Filed: Dec. 30, 2022

(65) Prior Publication Data

US 2024/0224411 A1 Jul. 4, 2024

(51) Int. Cl.
  *H05K 1/02* (2006.01)
(52) U.S. Cl.
  CPC ........... *H05K 1/023* (2013.01); *H05K 1/0207* (2013.01); *H05K 2201/10416* (2013.01)
(58) Field of Classification Search
  CPC ................. H05K 1/023; H05K 1/0207; H05K 2201/10416
  See application file for complete search history.

(56) References Cited

U.S. PATENT DOCUMENTS

| | | | |
|---|---|---|---|
| 5,933,324 A | 8/1999 | Barrett | |
| 6,118,651 A | 9/2000 | Mehrotra | |
| 6,885,563 B2 | 4/2005 | Panella | |
| 6,982,481 B1 | 1/2006 | Sonderegger | |
| 7,235,875 B2 | 6/2007 | Booth, Jr. | |
| 7,463,474 B2 | 12/2008 | Ritter | |
| 9,472,347 B2 | 10/2016 | Abrecht | |
| 10,108,232 B2 | 10/2018 | Nicol | |
| 2009/0161318 A1 | 6/2009 | Sanderson | |

(Continued)

FOREIGN PATENT DOCUMENTS

| | | |
|---|---|---|
| CN | 212161588 U | 12/2020 |
| DE | 102015115145 A1 | 3/2017 |

OTHER PUBLICATIONS

Disclosed Anonymously. Jan. 26, 2007. "Method for a Heatsink Capacitor." IPCOM000145777D. https://priorart.ip.com/IPCOM/000145777.

(Continued)

*Primary Examiner* — Timothy J Thompson
(74) *Attorney, Agent, or Firm* — Kimberly Zillig

(57) ABSTRACT

An apparatus for providing a safety and EMC compliant heat sink. The apparatus includes a heat sink configured to be attached to an internal power plane of a printed circuit board (PCB). The heat sink includes a plurality of fins extending outward from the heat sink. The apparatus further includes a compliance cage configured to be connected to a ground portion of the PCB, the compliance cage surrounding at least a portion of the heat sink. At least one capacitor plate contacting at least a portion of the compliance cage and extending inwards towards the heat sink and interleaving with the plurality of fins is present. Dielectric spacers are provided to fill a portion of the space between the capacitor plates and the heat sink fins.

13 Claims, 4 Drawing Sheets

(56) References Cited

U.S. PATENT DOCUMENTS

| | | | |
|---|---|---|---|
| 2015/0223366 A1* | 8/2015 | Horiuchi | H05K 7/20254 |
| | | | 361/689 |
| 2015/0245533 A1* | 8/2015 | Wright | H05K 1/0254 |
| | | | 361/679.31 |
| 2017/0311478 A1* | 10/2017 | Engelhardt | H05K 7/2029 |
| 2021/0168965 A1* | 6/2021 | Shi | H01L 23/3677 |

OTHER PUBLICATIONS

Iguchi, Y. and Kobayashi, H. Jun. 1, 1994. "Flip-Chip Attachment Heatsink with Decoupling Capacitor." IPCOM000112636D. https://priorart.ip.com/IPCOM/000112636. Electronic Publication Date: Mar. 27, 2005.

Stadler, EE and Stahl, R. Apr. 1, 1986. Cover/Heat Sink Capacitor. IPCOM000060526D, https://priorart.ip.com/IPCOM/000060526. Electronic Publication Date: Mar. 8, 2005.

\* cited by examiner

SAFETY AND EMC COMPLIANT INTERNAL POWER PLANE HEAT SINK CAPACITOR

BACKGROUND

The present disclosure relates to heat dissipation, and more specifically, to providing a safety and electromagnetic compatibility (EMC) compliant heat dissipation solution.

It is often the case that printed circuit boards (PCBs) contain power planes on internal layers to distribute power to multiple electronic components. These power planes may carry a significant amount of current for the circuitry to perform as desired. This leads to high temperatures within the PCB. Excessive heat in a PCB can cause certain types of damage such as warping, loss of structural integrity, disruption of circuit lines due to thermal expansion, splitting of layers due to incompatible rates of material expansion, and oxidation.

SUMMARY

Embodiments of the present disclosure are directed to an apparatus for providing a safety and EMC compliant heat sink capacitor. The apparatus includes a heat sink configured to be attached to an internal power plane of a printed circuit board (PCB). The heat sink includes a plurality of fins extending outward from the heat sink. The apparatus further includes a compliance cage configured to be connected to a ground portion of the PCB, the compliance cage surrounding at least a portion of the heat sink. At least one capacitor plate contacting at least a portion of the compliance cage and extending inwards towards the heat sink and interleaving with the plurality of fins is present. Dielectric spacers are provided to fill a portion of the space between the capacitor plates and the heat sink fins.

Embodiments of the present disclosure are directed to a printed circuit board having at least one safety and EMC compliant heat sink capacitor connected. The apparatus includes a heat sink configured to be attached to an internal power plane of a printed circuit board (PCB). The heat sink includes a plurality of fins extending outward from the heat sink. The apparatus further includes a compliance cage configured to be connected to a ground portion of the PCB, the compliance cage surrounding at least a portion of the heat sink. At least one capacitor plate contacting at least a portion of the compliance cage and extending inwards towards the heat sink and interleaving with the plurality of fins is present. Dielectric spacers are provided to fill a portion of the space between the capacitor plates and the heat sink fins.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
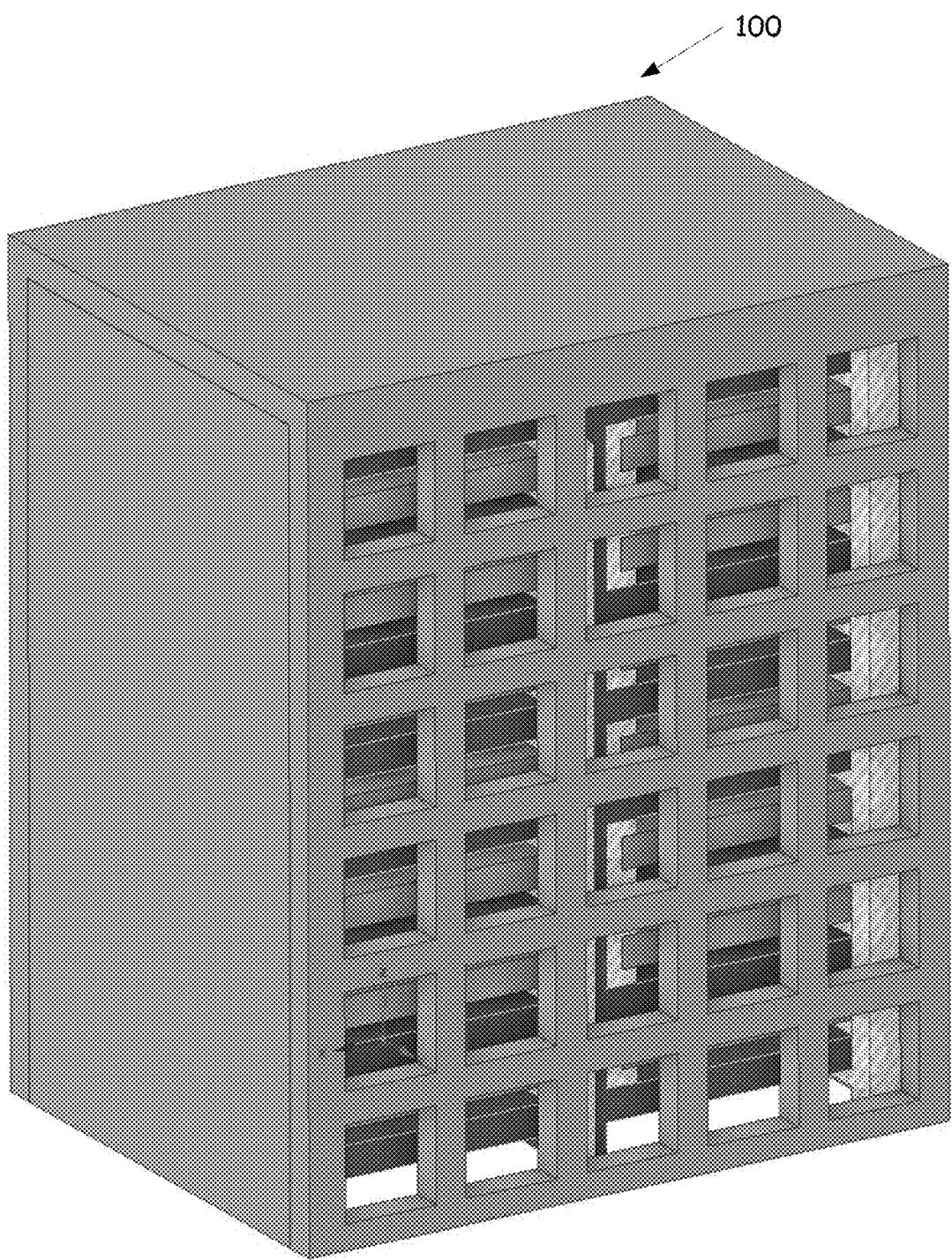
FIG. 1 shows a safety and EMC compliant internal power plane heat sink capacitor apparatus.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to heat dissipation, and more specifically, to providing a safety and EMC compliant heat dissipation solution. While the present disclosure is not necessarily limited to such applications, various aspects of the disclosure may be appreciated through a discussion of various examples using this context.

It is often the case that printed circuit boards (PCBs) contain power planes on internal layers to distribute power to multiple electronic components. These power planes may carry a significant amount of current for the circuitry to perform as desired. This leads to high temperatures within the PCB. Excessive heat in a PCB can cause certain types of damage.

For example, one type of damage can result in a loss of structural integrity. Excessive heat can damage the integrity of a PCB. The layers of a PCB are highly sensitive to fluctuations in temperature, and when they get too hot or cold, they expand and/or contract. As such, excessive heat can lead to warping in the lengths, widths, and thicknesses of different PCB layers.

Another possible type of damage is disruption of circuit lines. Excessive heat can result in circuit damage. The circuit lines expand and change shape when they overheat. Once this happens, the circuits become susceptible to frequency shifts, distortions, and straight losses. Their conductor impedance can also shift from its standard value. Millimeter-wave circuits and microwave circuits, in particular, have tiny, delicate components that can easily sustain damage if they expand and deform at high temperatures.

Yet another type of damage is due to incompatible rates of material expansion: The detrimental effects noted above are compounded by the fact that different materials expand at different rates. A PCB has two basic types of layers: dielectric layers and conductive metal layers. Because they contain different materials, they expand differently in response to heat. So an overheating PCB may experience further damage as the different types of layers pull apart.

Damage due to heating can also come from oxidation. Oxidation of PCB components is also a concern at high temperatures. Exposed dielectric material in PCBs does not have protection against oxidation if it does not have a protective laminate coating. In that case, the material may rust after exposure to high heat. Loss of transmission lines and a higher dissipation factor often result.

Figure 2A:
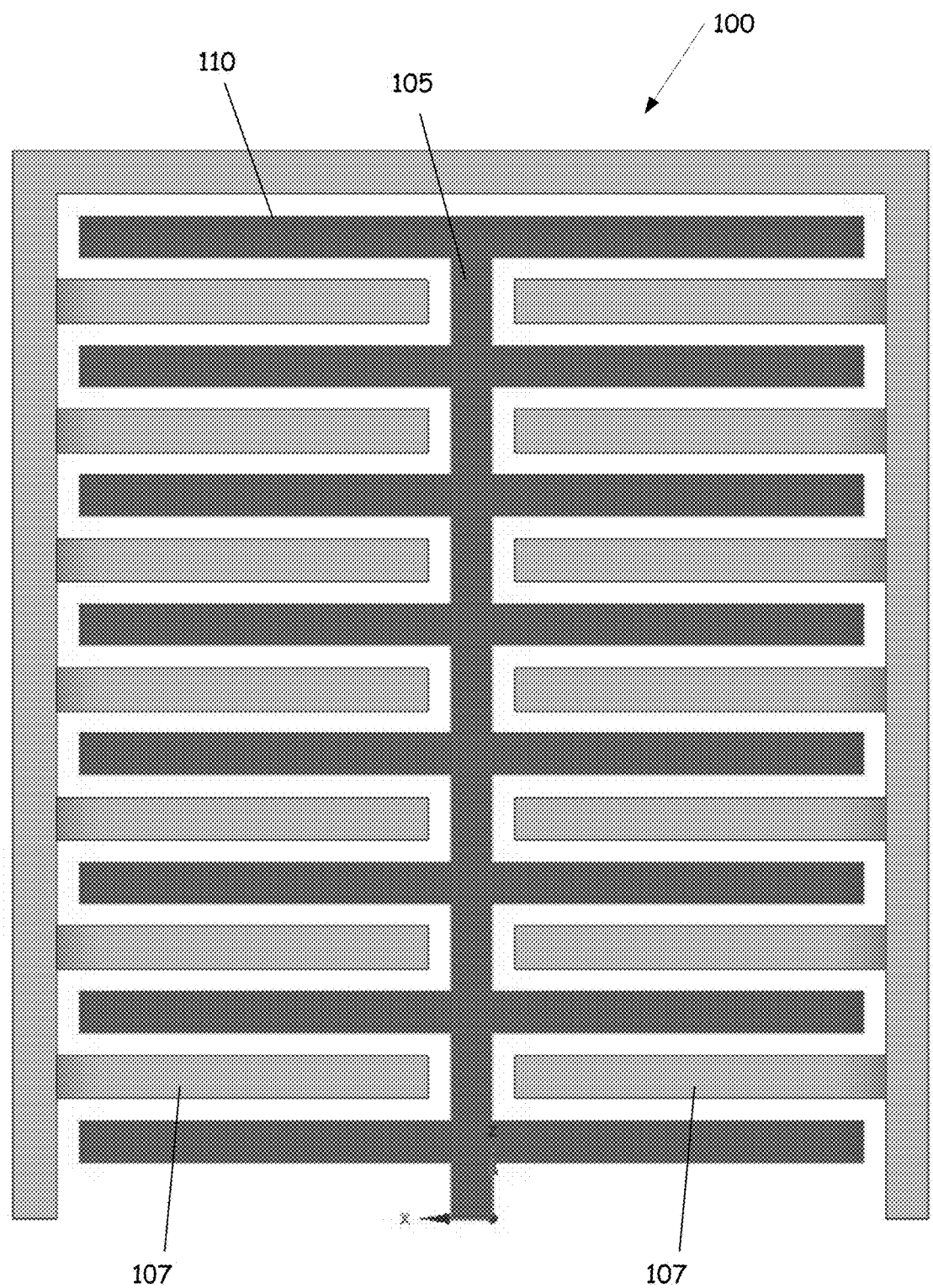
FIG. 2A shows only the internal power plane heat sink and capacitor plates.
Figure 2B:
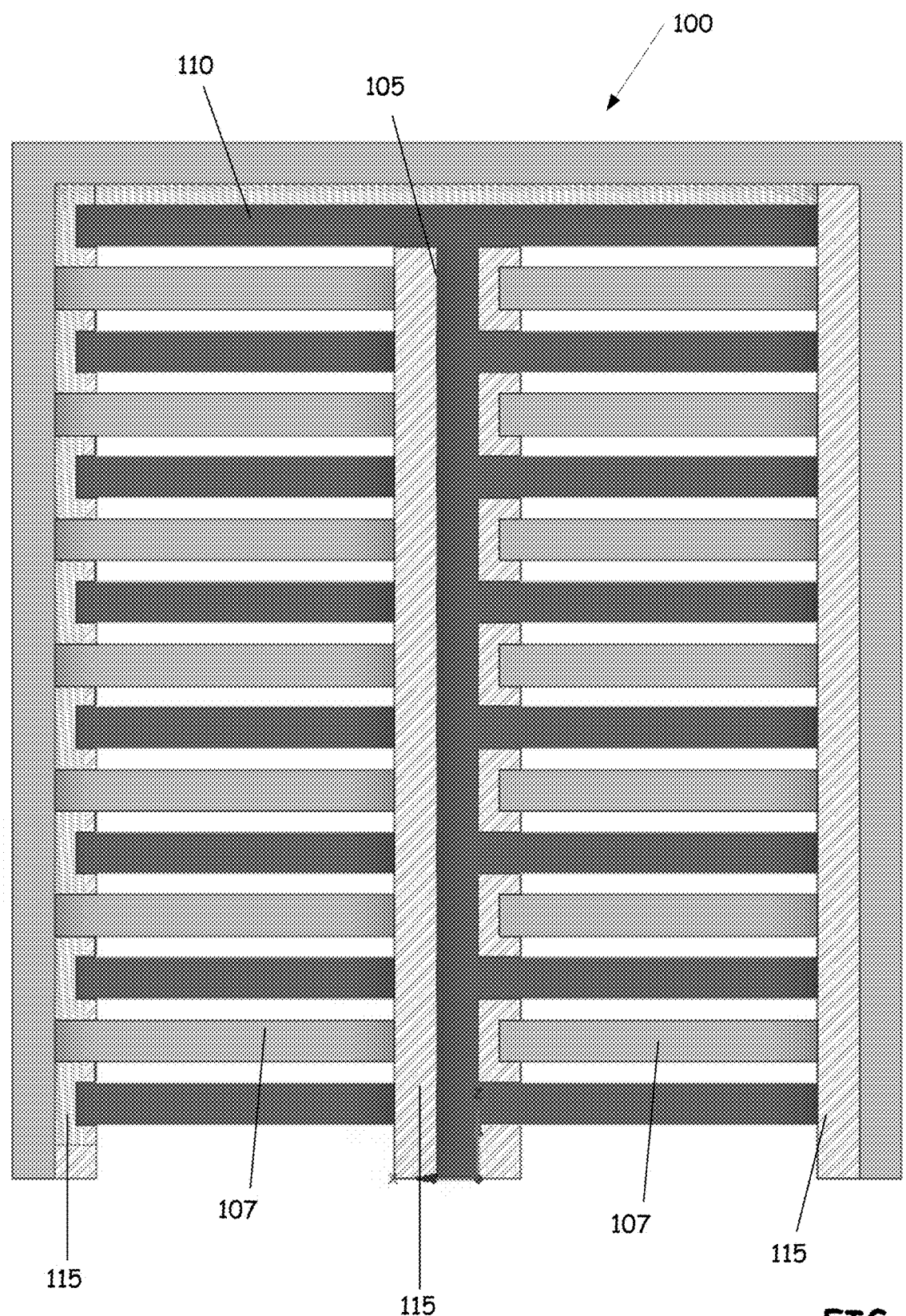
FIG. 2B builds on FIG. 2A by including dielectric spacers.
Figure 2C:
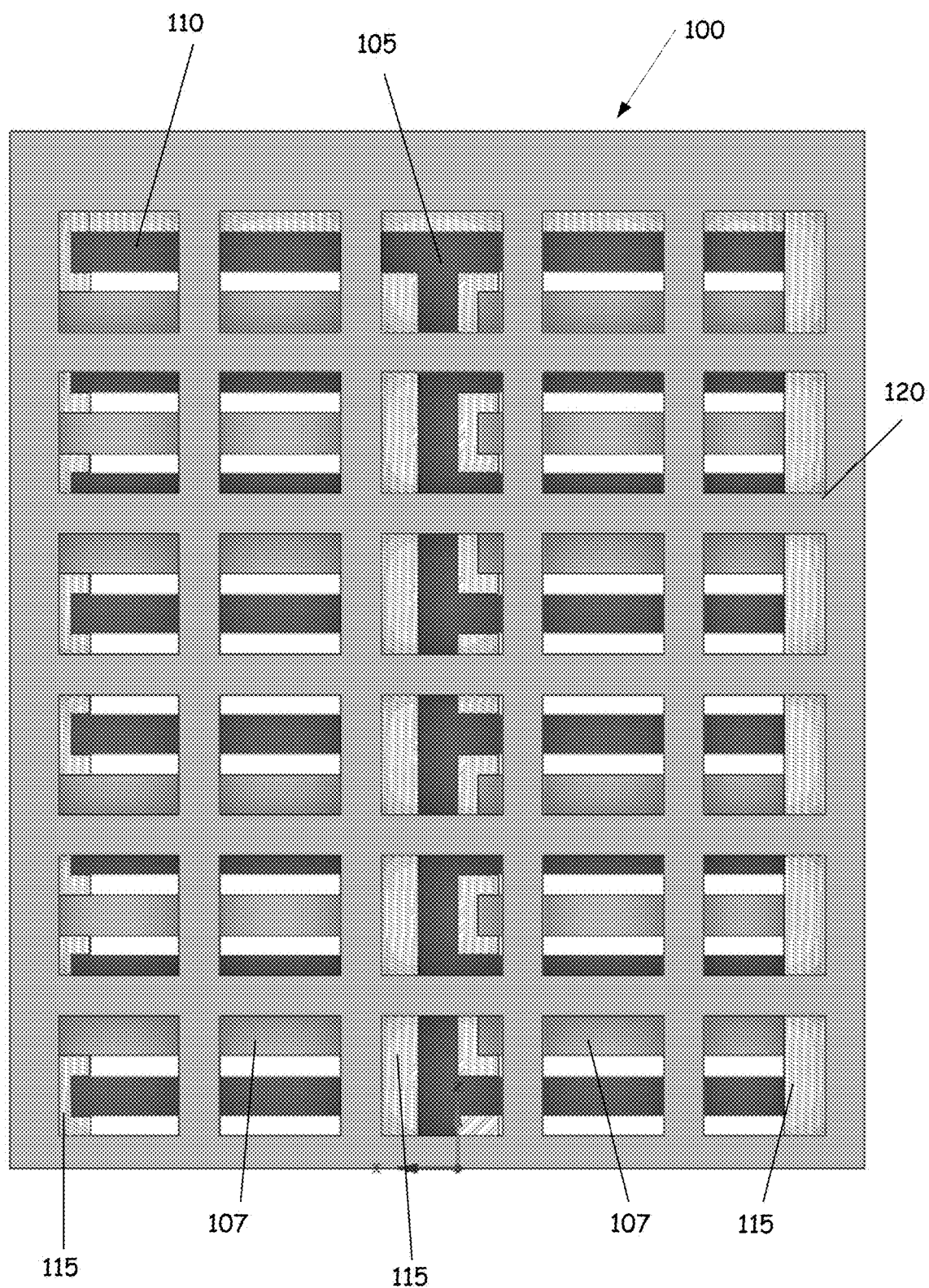
FIG. 2C builds on FIG. 2B by including compliance cage.

FIG. 1 is a perspective view of a safety and EMC compliant internal power plane heat sink capacitor apparatus 100 according to embodiments of the present disclosure. FIGS. 2A-2C illustrate a side profile of the apparatus in various states of disassembly. FIG. 2A is a side view of the apparatus illustrating the heat sink 105 and the capacitor plates 110. FIG. 2B adds the dielectric spacers 115 to the heat sink 105 and the capacitor plates 110. FIG. 2C adds the compliance cage 120 to the heat sink 105, the capacitor plates 110, and the dielectric spacers 115. For purposes of this discussion FIGS. 1, 2A, 2B, and 2C will be discussed together.

The heat sink 105 is a component of the system that is configured to remove heat that is generated during the operation of the circuitry on a printed circuit board. The heat sink 105 is made from a material that is conducive to the transfer of heat such as aluminum or copper. The heat sink 105 is connected to an internal power plane and contains a tower with a plurality of fins 107. The fins 107 enhance the ability of the heat sink 105 to dissipate heat from the system. The fins 107 can be in one or more different arrangements relative to the surface of the PCB and the airflow across the surface of the PCB, such as horizontal, vertical, or angled therebetween. In some embodiments, multiple heat sinks can be connected to at least one of the fins 107.

In some embodiments the heat sink 105 is connected to the power plane of the PCB through one or more vias. However, in other embodiments, the connection can be made through the use of a screw, a bolt, or other connection methods. The heat sink 105 can be located anywhere on the PCB. However, to gain the greatest efficiency the heat sink 105 should be placed in a location that is expected to generate excessive heat on the internal power plane it is connected to. The heat sink 105 can be placed above or below the PCB. In some embodiments where multiple heat sinks are used, the heat sinks can be placed on the same surface (i.e. above or below the PCB) or can be placed on opposite sides of the PCB (i.e. some above the surface of the PCB and some below the surface of the PCB). Further, the heat sink 105 is placed, where possible, such that the fins 107 of the heat sink 105 are in an area of direct airflow so as to maximize the cooling of the power plane.

Due to the arrangement of the heat sink 105 on the PCB, the connection to the power plane, and that it extends out from the PCB, electromagnetic compatibility issues can arise. Specifically, the heat sink 105 will act as an antenna that radiates energy. This radiated energy can interfere with other components within the system. Further this configuration of the heat sink 105 can lead to safety issues as well. Specifically, as the heat sink 105 is connected to the power plane, this creates an electrical potential between the heat sink 105 and ground (e.g. 3.3 Vdc, 5 Vdc, 12 Vdc, 48 Vdc, 250 Vdc). Further, the heat sink 105 can also be carrying a significant amount of current. This exposed energy can cause harm to a person if they were to come into contact with the heat sink 105, such as when servicing the area near the heat sink 105.

The capacitor plates 110 are a component of the system that provides both capacitance and protection for the heat sink 105. The capacitor plates 110 are connected to ground on the PCB. The capacitor plates 110 are also configured to block physical access to the sides and top of heat sink 105 to provide some level of protection from accidental contact with the heat sink 105. The capacitor plates 110 extend inward towards and interleaves with the fins 107 of the heat sink 105. The capacitor plates 110 are also configured to adjust an amount of capacitance delivered to the PCB board. In the design of the apparatus adjustments can be made to the number of capacitor plates 110, the area of overlap between capacitor plates 110 and heat sink fins 107, and/or the distance between capacitor plates 110 and heat sink fins 107. This is dependent on the specific performance desired from the apparatus. Air flows between the dielectric between capacitor plates 110 and heat sink fins 107 to allow for cooling. Additionally, the capacitor plates 110 can be connected to the ground plane of the PCB in the same manner as the heat sink 105 can be connected to the power plane (e.g., vias, screw, bolt, etc.). Portions of the capacitor plates 110 run parallel to the fins 107 of the heat sink 105 in the space between the fins 107.

Dielectric spacers 115 are a component of the system that is configured to prevent shorting between the heat sink 105 and the capacitor plate. Specifically, the dielectric spacers 115 prevent shorting between the fins 107 of the heat sink 105 and the capacitor plate 110. Additional the dielectric spacers 115 can function to help ensure that clearance requirements from various safety standards can be maintained.

Table 1 is a table illustrating the minimum clearance distances in millimeters required for voltages with frequencies up to 30 kHz according to the 62368 safety standard of the International Electrotechnical Commission (IEC) and UL.

TABLE 1

| Voltage Up To And Including Peak | Basic Insulation or Supplementary Insulation mm Pollution Degree | | | Reinforced Insulation mm Pollution Degree | | |
|---|---|---|---|---|---|---|
| | 1 | 2 | 3 | 1 | 2 | 3 |
| 330 | 0.01 | 0.2 | 0.5 | 0.02 | 0.4 | 1.5 |
| 400 | 0.02 | | | 0.04 | | |
| 500 | 0.04 | | | 0.08 | | |
| 600 | 0.06 | | | 0.12 | | |
| 800 | 313 | | | 0.26 | | |
| 1000 | 0.26 | 0.26 | | 0.52 | 0.52 | |
| 1200 | 0.42 | | | 0.84 | | |
| 1500 | 0.76 | | | 1.52 | | 1.6 |

Table 2 is a table illustrating the minimum clearance distances in millimeters required for voltages with frequencies above 30 kHz according to the 62368 safety standard of the IEC and UL.

TABLE 2

| Voltage Up To And Including Peak | Basic Insulation or Supplementary Insulation mm | Reinforced Insulation mm |
|---|---|---|
| 600 | 0.07 | 0.14 |
| 800 | 0.22 | 0.44 |
| 1000 | 0.6 | 1.2 |

These tables show the clearance requirements for typical power plane voltages (e.g., 3V, 5V, 12V). For example, in a system using pollution degree 2 the clearance between capacitor plates 110 and heat sink fins 107 would need to meet 0.2 mm for basic insulation and 0.4 mm for reinforced insulation. By using the dielectric spacer 115 to separate the heat sink 105 and the capacitor plates 110, the desired spacing can be achieved while providing additional benefits.

As the spacers 115 are made of a dielectric material (non-conductive) they are able to provide a way to further tune to a desired capacitance. The spacers 115 provide an optimal way to change the capacitance of the structure. By selecting dielectric spacers 115 with a permittivity in the range of a class 2 capacitor allows the structure illustrated in FIG. 1 to achieve a capacitance level typically selected for a decoupling capacitor (e.g., 1 pF, 10 pF, 100 pF). Decoupling capacitors are typically used to filter out electrical noise due to ringing signals, voltage drops, and voltage spikes.

Compliance cage 120 is a component of the system that is positioned over heat sink 105 and capacitor plates 110 to provide additional protection. The compliance cage 120 is connected to ground on the PCB. Because the compliance cage 120 is grounded, it provides safety protection to any person that may come in contact with apparatus 100. However, in some embodiments the compliance cage 120 is grounded via a connection through capacitor plates 110. The compliance cage 120 acts as a faraday cage to shield against radiated emissions from the heat sink 105, and provide immunity from other noise in the environment coupling onto the heat sink 105 and transferring to the internal power plane and the components connected to it. In some embodiments, the cage portion of the structure covers only the front and back of the structure since capacitor plates 110 already cover the sides of the structure.

The size of the openings of compliance cage 120 can be designed based on the frequencies present on the internal power plane and/or the frequencies that may be present within the overall environment. For example, if a designer wanted shielding up to 40 GHz, the largest dimensional opening (e.g., diagonal if the openings are squares) should be smaller than a quarter wavelength at that frequency (i.e., less than 1.875 mm). In some embodiments, when the heat sink 105 is connected to a power plane that operates at low frequency, the openings may be larger, due to the low frequency. However, the size of the openings are limited in size based on the safety standard test finger size, such that a finger of that size cannot pass through the openings in the cage 120. In some embodiments, instead of square openings illustrated in the FIGs, different types of openings can be used, such as rectangular, honeycomb, triangular, etc.

In some embodiments the apparatus can be configured to provide variable capacitance. In these embodiments, the capacitor plates 110 can be moved with respect to the heat sink fins 107 to allow for a specific capacitance. The range of the variable capacitance is limited by the geometry of the overall apparatus. To make the adjustments a user can use a mechanical mechanism such as a wheel, switch, or knob to move the capacitor plates 110 relative to the heat sink fins 107. In some embodiments, the compliance cage 120 is designed such that the user can squeeze or pull apart the compliance cage 120 to physically move the capacitor plates 110 relative to the heat sink fins 107. Further, in these embodiments having variable capacitance, the apparatus can have a locking mechanism that holds the capacitor plates 110 in the desired position to prevent it from changing.

In an example experiment using the design of the present disclosure the effectiveness of the design was illustrated. As discussed, any one of the variables (A, D, $\varepsilon_r$) in the equation below can be varied to deliver a desired capacitance $$C = \frac{\varepsilon A}{D};$$ Equation 1

$$\varepsilon = \varepsilon_r \varepsilon_0$$

Where C=Capacitance, $\varepsilon$=Permittivity, $\varepsilon_r$=Relative permittivity, $\varepsilon_0$=Vacuum permittivity, A=Area, and D=Distance between plates.

Using a simulation in ANSYS Q3D where the heat sink 105 was defined as a signal net, the capacitor plates 110 and the compliance cage 120 were defined as ground nets. $\varepsilon_r$ was adjusted through the use of the dielectric spacers 115. The results of the simulation through a range of permittivity range of class 2 capacitors ($200 \leq \varepsilon_r \leq 14000$) resulted in a capacitance of ~4 nF when $\varepsilon_r$=200 and a capacitance of ~276 nF when $\varepsilon_r$=14000.

During this simulation it was observed that a single apparatus 100 reduced the temperature on the internal power plane from 110° C. to 86.1° C. When two of the apparatus 100 were used the temperature was further reduced to 79.5° C. This simulation was based upon simulated conditions of 10 W in the PCB having a 60 mm by 30 mm size and a flow rate of 5 cfm at 25° C.

A brief summary of the present disclosure can be made with reference to the following clauses 1. An internal power plane heat sink apparatus comprising:
    a heat sink configured to be attached to an internal power plane of a printed circuit board, the heat sink having a plurality of fins extending outward from the heat sink;
    a compliance cage configured to be connected to a ground portion of the PCB, the compliance cage surrounding at least a portion of the heat sink; and
    at least one capacitor plate contacting at least a portion of the compliance cage and extending inwards towards the heat sink and interleaving with the plurality of fins.
2. The apparatus of clause 1 wherein the compliance cage is a faraday cage.
3. The apparatus of clauses 1 or 2 wherein the compliance cage is configured to shield the heat sink from external fields that can couple onto the heat sink and wherein the compliance cage is configured to shield fields radiation from the heat sink.
4. The apparatus of any of the preceding clauses wherein the compliance cage has a plurality of openings, and wherein the size of the plurality of openings is sized such that a human finger cannot touch the heat sink through the plurality of openings.
5. The apparatus of the preceding clauses further comprising, at least one spacer disposed between the at least one capacitor plate and the plurality of fins.
6. The apparatus of the preceding clauses further comprising, a second heat sink or heat sink tower, wherein the heat sink tower and the second heat sink tower are connected to each other by at least one of the plurality of fins.
7. The apparatus of the preceding clauses wherein a space between the at least one capacitor plate and the plurality of fins is configured to generate a capacitance.
8. The apparatus of the preceding clauses wherein the capacitance is tunable.
9. The apparatus of the preceding clauses further comprising an adjustment mechanism attached to the compliance cage configured to tune the capacitance.
10. The apparatus of the preceding clauses wherein the adjustment mechanism is configured to do one or more of squeezing together or pulling apart the at least one capacitor plate and at least one of the plurality of fins to change the space between the at least one capacitor plate and the at least one of the plurality of fins, changing the overlapping area between the at least one capacitor plate and the at least one of the plurality of fins, changing the size of the capacitor plates, and changing the size of the heatsink fins.
11. The apparatus of the preceding clauses wherein the tuning mechanism is selected from the group consisting of a wheel, a switch, and a knob.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An internal power plane heat sink apparatus, configured to be attached to an internal power plane of a printed circuit board, comprising:
   a heat sink having a plurality of fins extending outward from the heat sink;
   a compliance cage surrounding at least a portion of the heat sink; and
   at least one capacitor plate contacting at least a portion of the compliance cage and extending inwards towards the heat sink and interleaving with the plurality of fins.

2. The apparatus of claim 1, wherein the compliance cage is a faraday cage.

3. The apparatus of claim 2, wherein the compliance cage is configured to shield the heat sink from external fields that can couple onto the heat sink.

4. The apparatus of claim 1, wherein the compliance cage has a plurality of openings, and wherein a size of the plurality of openings is sized such that a human finger cannot touch the heat sink through the plurality of openings.

5. The apparatus of claim 1, further comprising:
   at least one spacer disposed between the at least one capacitor plate and the plurality of fins.

6. The apparatus of claim 1, further comprising:
   a second heat sink, wherein the heat sink and the second heat sink are connected to each other by at least one of the plurality of fins.

7. The apparatus of claim 1, wherein a space between the at least one capacitor plate and the plurality of fins is configured to generate a capacitance.

8. A printed circuit board (PCB) assembly comprising:
   a printed circuit board; and
   an internal power plane heat sink apparatus connected to the PCB, the apparatus comprising:
      a heat sink having a plurality of fins extending outward from the heat sink;
      a compliance cage connected to a ground portion of the PCB, the compliance cage surrounding at least a portion of the heat sink; and
      at least one capacitor plate contacting at least a portion of the compliance cage and extending inwards towards the heat sink and interleaving with the plurality of fins.

9. The PCB assembly of claim 8, wherein the compliance cage has a plurality of openings, and wherein a size of the plurality of openings is sized such that a human finger cannot touch the heat sink through the plurality of openings.

10. The PCB assembly of claim 8, further comprising:
    at least one spacer disposed between the at least one capacitor plate and the plurality of fins.

11. The PCB assembly of claim 8, further comprising:
    a second heat sink, wherein the heat sink and the second heat sink are connected to each other by at least one of the plurality of fins.

12. The PCB assembly of claim 8, wherein a space between the at least one capacitor plate and the plurality of fins is configured to generate a capacitance.

13. The PCB assembly of claim 8, further comprising:
    at least a second internal power plane heat sink apparatus connected to the PCB.

* * * * *